United States Patent [19]

Samarov

[11] Patent Number: 5,172,755
[45] Date of Patent: Dec. 22, 1992

[54] ARCUATE PROFILED HEATSINK APPARATUS AND METHOD

[75] Inventor: Victor M. Samarov, Carlisle, Mass.

[73] Assignee: Digital Equipment Corporation, Maynard, Mass.

[21] Appl. No.: 861,724

[22] Filed: Apr. 1, 1992

[51] Int. Cl.⁵ .......................................... H01L 23/40
[52] U.S. Cl. .................................. 165/80.3; 165/80.2; 165/185; 361/386
[58] Field of Search .................. 165/80.1–80.4, 165/185, 1; 118/724, 725, 728; 361/386

[56] References Cited

U.S. PATENT DOCUMENTS

| | | | |
|---|---|---|---|
| 3,780,795 | 12/1973 | Arnold | 165/80 |
| 4,151,547 | 4/1979 | Rhoades et al. | 357/81 |
| 4,415,025 | 11/1983 | Horvath | 165/185 |
| 4,535,835 | 8/1985 | Holden | 165/80.1 |
| 4,611,238 | 9/1986 | Lewis et al. | 357/81 |
| 4,802,532 | 2/1989 | Dawes et al. | 165/80.3 |
| 4,854,377 | 8/1989 | Komoto et al. | 165/80.4 |
| 4,872,505 | 10/1989 | Jones et al. | 165/80.3 |
| 4,979,074 | 12/1990 | Morley et al. | 361/386 |

OTHER PUBLICATIONS

Irving Granet, *Strength of Materials for Engineering Technology*, second edition, published by Reston Publishing Company, Reston, VA, 1980, p. 328, Table 8.2, example 9.

*Steel Plate Engineering Data—vol. 2: Useful Information on the Design of Plate Structures*, published by the Commitee of Steel Plate Producers, American Iron and Steel Institute, 1000 16th Street, N.W., Washington, D.C. 20036, Jun. 1985, p. 5, Table 1B, under the title "Stress and Deflection Coefficients-Rectangle".

*Primary Examiner*—Allen J. Flanigan
*Attorney, Agent, or Firm*—Ronald E. Myrick; Barry N. Young; A. Sidney Johnston

[57] ABSTRACT

An arcuate profiled heatsink is disclosed, over which is flexed and attached a substrate on which are mounted heat producing, temperature sensitive electronic devices. Flexing the substrate to conform with the arcuate surface of the heatsink minimizes air pockets between the two, which would ordinarily result due to warpage resulting from the fabrication of the substrate. The interface between heatsink and substrate, therefore, has lower thermal resistance, thus, increasing thermal conductivity between heatsink and substrate, and increasing the amount of heat dissipated by the heatsink. Because no hard joining of the two parts is required, they may be separated for repair, and stress resulting from thermal expansion mismatch will not be transferred to the substrate.

24 Claims, 7 Drawing Sheets

ARCUATE PROFILED HEATSINK APPARATUS AND METHOD

FIELD OF THE INVENTION

This invention relates to a cooling apparatus and more particularly to a heat sink for use with a thick film substrate on which are mounted heat producing, temperature sensitive electronic devices.

BACKGROUND INFORMATION

In recent years, integrated circuit devices have steadily become smaller, with increased internal signal speeds. As a result, their power densities have become greater, causing increased heat generation during operation. Overheating of integrated circuit devices may result in their failure or destruction. The need for effective heat removal techniques in this area is a basic problem.

The problem of heat removal from integrated circuit devices is accentuated when they are mounted on a supporting substrate with solder terminals for connecting electrodes on the devices to electrically conductive traces on the substrate. In such a solder bonded device a significant portion of the heat is usually removed from the side of the device in contact with the substrate. The removed heat travels through the substrate, to a heat exchanger in thermal contact with the substrate. A dense placement of a plurality of such devices on a single multi-layer, or "thick film", ceramic substrate further significantly increases the amount of heat to be removed through the substrate.

In prior art systems the above mentioned heat exchanger is implemented as a heatsink placed in thermal contact with a surface of the substrate on which no circuit devices are mounted. A gaseous or liquid coolant may further be used to remove the heat from the heatsink. A key consideration in maximizing heat flow away from the integrated circuit devices, is maximizing thermal conductivity between the substrate and the heatsink. Air pockets between the substrate and the heatsink increase thermal resistance, and are therefore undesirable.

Substrate warpage induced during fabrication accentuates this problem. Substrates are typically a sandwich construction, with alternating layers of copper and ceramic. Substrate fabrication involves a repetitive firing process. Because the copper and ceramic substrate layers have dissimilar thermal expansion coefficients, the repetitive firing process causes the substrate to be initially warped. The degree of the initial warpage is not accurately predictable. If a warped substrate were simply mated with a flat heatsink surface, unacceptably large air pockets would exist between the substrate and the heatsink.

In addition to these relatively large air pockets, smaller air pockets may be caused by microscopic irregularities in the finishes of the substrate and heatsink attachment surfaces. To reduce both large and microscopic air pockets between substrate and heatsink, and thereby provide a more thermally conductive interface, there currently exist several approaches.

One approach is to use a thermally-conductive adhesive between the heatsink and the substrate. The adhesive compensates for the initial warpage of the substrate, and will conform to any surface irregularities as well. As a result, essentially all air pockets between substrate and heatsink are eliminated. However, there are disadvantages. First, even so-called "flexible" adhesives form a strong bond between the substrate and the heatsink. The rigidity of the adhesive bond increases the risk of failure due to fatigue caused by cyclical stress. Cyclical stress occurs as the device temperature changes through being powered u and down. During each of these power cycles, the adhesive bond transmits stress resulting from the dissimilar thermal expansion rates of the substrate and heatsink to the substrate. This stress, and the resultant fatigue, may cause the substrate to crack or break, causing failure in the electrical circuit carried thereon. The adhesive bond also prevents separation of the parts for repair purposes. Furthermore, adhesives generally are relatively poor heat conductors and contribute to the overall thermal resistance between the substrate and the heatsink. Finally, applying adhesives in a manufacturing environment requires expensive and cumbersome dispensing and curing equipment, making their use undesirable from a manufacturability perspective.

A second approach i to introduce a gasket-type interface material between the two parts. A separate gasket part is placed between substrate and heatsink to act as a thermal bridge. Gaskets are relatively easy to handle and install at assembly time. Unlike adhesives, they do not form a rigid bond between the substrate and heat sink. Typical gasket materials, however, lack the compliance necessary to compensate for the initial warpage of ceramic substrates, and their thermal conductivity is relatively poor. Gaskets also are generally not effective in reducing the microscopic air pockets resulting from irregularities in the surface finish of the parts.

A third approach uses a thermal grease to interface between the parts. Like thermal adhesives, thermal greases can essentially eliminate all air pockets between the parts. Unlike thermal adhesives, they produce a stress-free interface between the parts. The disadvantages of thermal greases are that they require cumbersome dispensing equipment at assembly time, have relatively poor thermal conductivity, and tend to migrate away from the interface. As the grease migrates away from the interface, air pockets may again result, increasing thermal resistance between the parts. Should the migrating grease come to rest on an electrical connection, it could interfere with the connection.

A new heatsink is desirable which will maximize thermal conductivity between the heatsink and the substrate by minimizing the air pockets between the two, and also be inexpensive to produce, and be easily repaired.

SUMMARY OF THE INVENTION

In accordance with principles of the invention, there is provided a heatsink, with a convex arcuate attachment surface, over which is flexed and attached a thick film substrate carrying electronic circuits. The arcuate attachment surface of the heatsink is shaped such that when the substrate is attached to it, the substrate is flexed to a greater degree than the substrate's initial fabrication warpage, but to a lesser degree than a safe percentage of the substrate's ultimate strength.

By flexing the substrate over the arcuate attachment surface of the heatsink, the substrate is made to accurately conform to the attachment surface. An interface between the heatsink and the substrate with minimal thermal resistance is thereby created, without the significant air pockets that would otherwise result from the warpage of the substrate incurred during its fabrication. The interface between the heatsink and the substrate, thus, has a low thermal resistance, increasing the amount of heat transferred to and dissipated by the heatsink. Because there is no rigid bond between the heatsink and the substrate, stress caused by thermal expansion mismatch between the heatsink and the substrate is not transferred to the substrate. In addition, because the heatsink and the substrate are not permanently mated, they can easily be separated for repair.

These and other features and advantages of the present invention will become apparent from a reading of the detailed description in conjunction with the attached drawings in which like reference numerals refer to like elements in the several views.

DETAILED DESCRIPTION OF THE DRAWINGS

Figure 1:
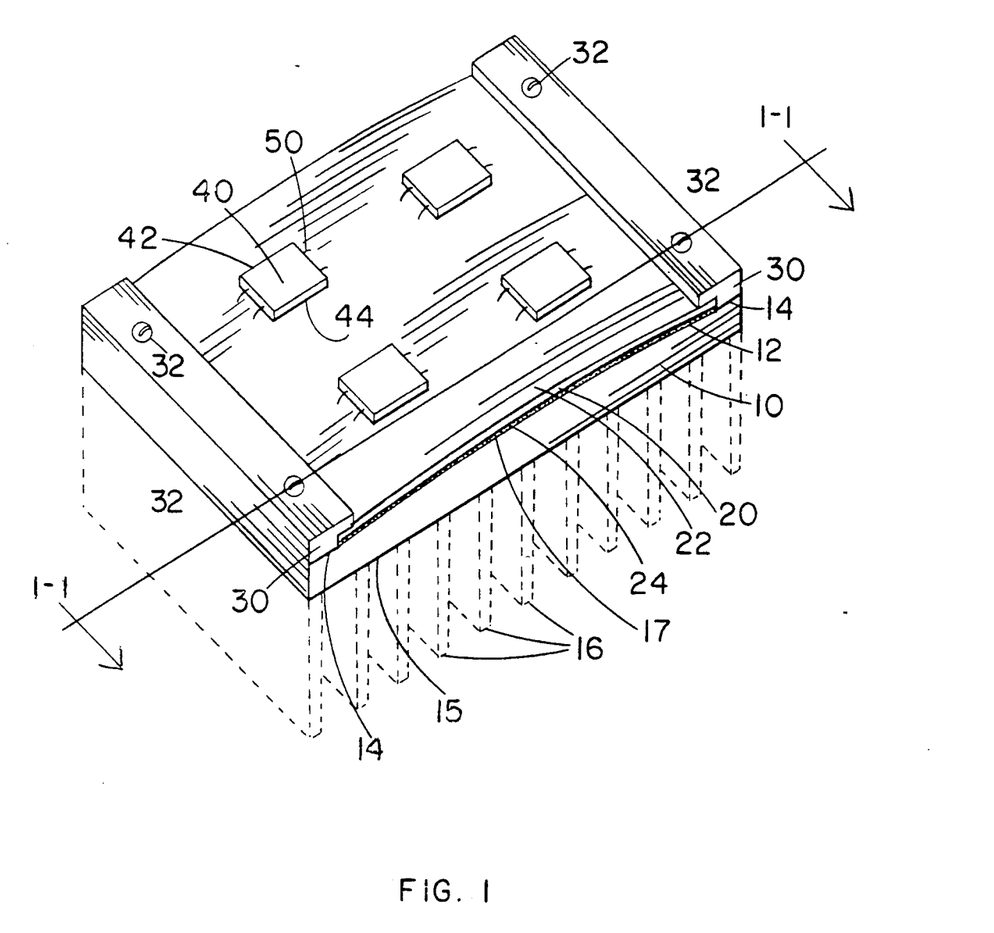
FIG. 1 is an isometric view of a first embodiment of a cooling apparatus.

FIG. 1 shows a first embodiment of a cooling apparatus in accordance with the principles of the invention. In FIG. 1 there is shown a rectangular shaped heatsink 10, made of a relatively thermally conductive material, for example aluminum. Heatsink 10 includes an arcuate surface 12, two flat surfaces 14 adjacent to the ends of the arcuate surface 12, and a surface 15 opposite the arcuate surface 12. Surface 15 of the heatsink 10 may optionally have heat dissipating fins 16 (shown in phantom), or pins (not shown).

Attached to the arcuate surface 12 of the heatsink 10 is a rectangular shaped substrate 20, made of a relatively thermally conductive dielectric material, by way of example aluminum oxide, with a first surface 22, and a second surface 24. The second surface 24 of the substrate 20 is in close contact with the arcuate surface 12 of the heatsink 10. Between the arcuate surface 12 of the heatsink 10 and the second surface 24 of the substrate 20 there may optionally be a very thin (e.g. less than 0.001 inch) layer of a thermally conductive agent 17, for example polyphenyl ether. The substrate 20 is held in place against the heatsink by attachment means, for example, notched retainer strips 30 and screws 32.

A plurality of heat producing and temperature sensitive electronic devices 40, with top surfaces 42, and bottom surfaces 44, are mounted on the substrate 20 with the bottom surfaces 44 in contact with the first surface 22 of the substrate 20. The electrodes of the electronic devices 40 are attached to the circuit traces (not shown) on first surface 22 of the substrate 20 by means of electrically conductive terminals 50.

During operation of the electronic devices 40, heat is produced which must be removed to ensure proper operation and prevent failure of the electronic devices 40 (as described above). Heat is most conveniently transferred from the bottom surfaces 44 of the devices 40, to the first surface 22 of the substrate 20, through the substrate 20, from the second surface 24 of the substrate 20, to the arcuate surface 12 of the heatsink 10, and through the heatsink 10 for dissipation by a coolant. To remove the maximum amount of heat from the electronic devices 40 during their operation, air pockets between the substrate 20 and the heatsink 10, which introduce thermal resistance and limit the amount of heat transferred from the substrate 20 to the heatsink 10, are minimized.

Figure 2:
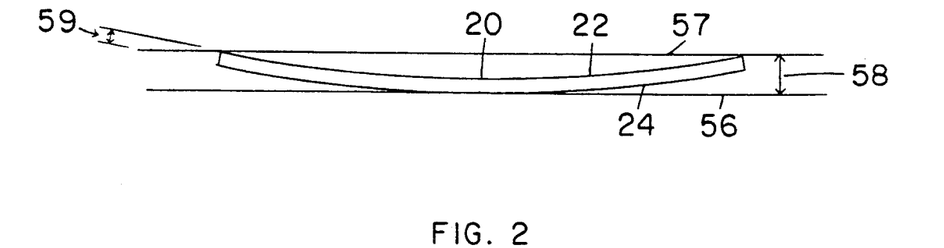
FIG. 2 shows a method for measuring the warpage of a substrate.

FIG. 2 shows a method for measuring the initial fabrication warpage of the substrate 20. The substrate 20 is placed between two parallel flat surfaces, such that a first side of the substrate 20 (for example, side 24), is in contact with a first flat surface 56, and the side opposite the first side of the substrate 20 (for example, side 22), is in contact with a second flat surface 57 parallel to the first flat surface 56. The warpage of the substrate 20, defined herein as deviation from flat, is equal to the distance 58 between the first flat surface 56, and the second parallel flat surface 57, when both flat surfaces are in contact with the substrate 20, minus the thickness 59 of the substrate 20.

The arcuate surface 12 of the heatsink 10 in FIG. 1 must be sufficiently arched such that the initial fabrication warpage of the substrate 20 is eliminated when the substrate 20 is flexed to conform with the arcuate surface 12, and then attached to the heatsink 10. Otherwise, air pockets will remain between the heatsink 10 and the substrate 20, limiting the amount of heat transferred from the heatsink 10 to the substrate 20. Also, the arcuate surface 12 of the heatsink 10 must not be so greatly arched that excessive stress is introduced into the substrate 20 when it is flexed to conform with the arcuate surface 12, and then attached to the heatsink 10. Such excessive stress could result in the substrate 20 cracking or breaking. The specific convex curve defining the profile of the arcuate surface 12 of the heatsink 10 should therefore be selected with these two considerations in mind, and should be symmetrical, with a maximum at its center.

Figure 3:
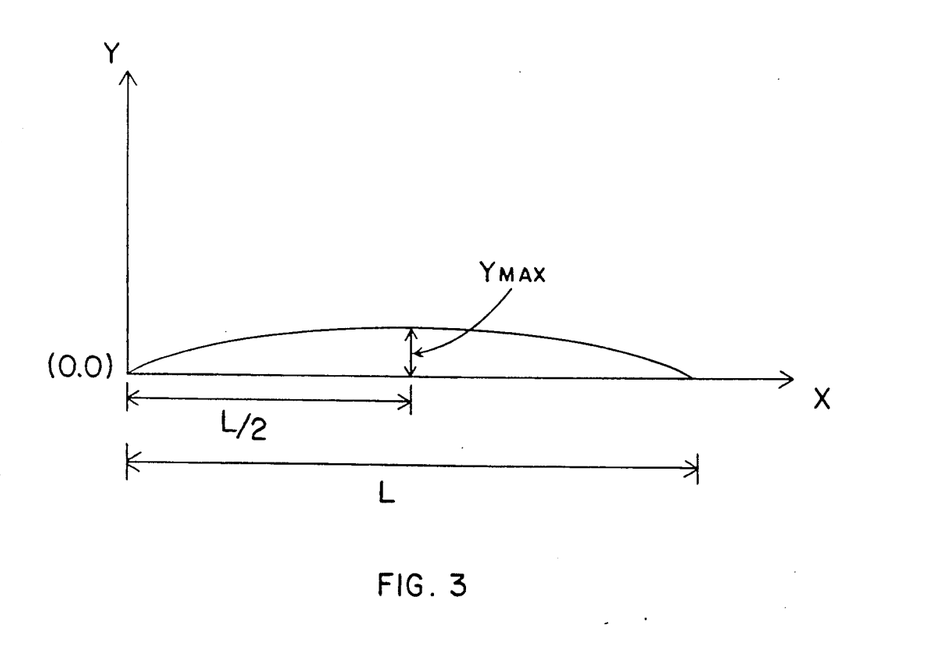
FIG. 3 shows the general contour of a convex curve having the inverted shape of a beam under a uniform load along its length.

FIG. 3 shows the general contour of a convex curve having the inverted shape of a beam under a uniform load along its length 'L'. The curve is symmetrical, and is seen to have a $Y_{max}$ at $X = L/2$, and a Y value of zero at $X = 0$, and $X = L$. The deflection of a beam simply supported at each end under a uniformly distributed load along its length is given by the equation:

$$Y = ((P * X)/(24 * E * I)) * (L^3 - (2 * L * X^2) + X^3)$$

where:
  P = a constant uniform pressure along the length of the beam;
  E = the Young's modulus of the beam material;
  I = the moment of inertia of the beam; and
  L = the length of the beam.

The above formula is shown in the book by Irving Granet, "Strength of Materials for engineering technology", second edition, published by Reston Publishing Company, Reston, Va., 1980 at page 328, Table 8.2, example 9, all disclosures of which are herein incorporated by reference.

Figure 4:
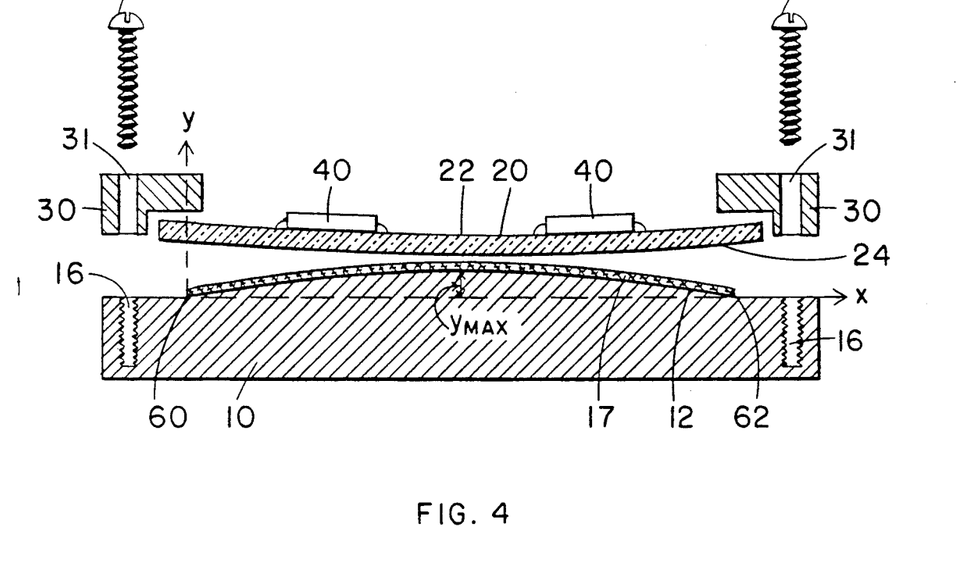
FIG. 4 is an exploded cross section view of the apparatus of FIG. 1 along line 1—1, prior to assembly.

FIG. 4 shows the apparatus of FIG. 1 prior to assembly. The screws 32 are aligned with holes 31 in the notched retainer strips 30. The holes 31 in the notched retainer strips 30 are aligned with threaded screw holes 16 in the heatsink 10. The substrate 20, on which are mounted the heat producing and temperature sensitive components 40, is mounted between the notched retainer strips 30 and the heatsink 10, such that the second surface 24 of the substrate 20 is opposite the arcuate surface 12 of the heatsink 10. The substrate 20 is shown having an initial warpage (defined as a deviation from flat), incurred during its fabrication. The optional thermally conductive agent 17 is shown on the arcuate surface 12 of the heatsink 10.

Now with reference to FIG. 4, a preferred first embodiment is described. The profile of the arcuate surface 12 of the heatsink 10 is a convex curve defined by the equation below, which is equivalent to the above equation for a beam under a uniform load along its length:

$$Y = P * C * (X/L - (2 * (X^3/L^3)) + X^4/L^4)$$

where:
P = a uniformly distributed load along the length L of the first surface 12 of the heatsink 10;
C = the flexural stiffness constant (see below) of the substrate 20;
L = the length along the arcuate first surface 12 of the heatsink 10, between point 60 and point 62; and
X and Y = coordinates with respect to a two-dimensional Cartesian coordinate system with origin at point 60, X axis extending along the line between point 60 and point 62, with Y axis perpendicular to the X axis.

The flexural stiffness constant C is calculated by the equation $C = L^4/24EI$. L is the length of the substrate 20. E is the Young's modulus of the material of the substrate 20. I is the moment of inertia of the substrate 20, relative to an axis passing through the geometric center of the substrate 20, parallel to the cross section of interest. I is calculated by the following equation:

$$I = W * T^3/12$$

where:
W = the width of the substrate 20; and
T = the substrate thickness.

The curve describing the arcuate surface 12 thus has a maximum ordinate Y value ($Y_{max}$) located symmetrically between end points 60 and 62. The value for P is selected so that $Y_{max}$ will exceed the initial warpage of the substrate 20, where warpage is defined as maximum deviation from flat. The value selected for P should also result in a $Y_{max}$ that is limited such that the flexure in the substrate 20 following attachment (see FIG. 3), does not introduce stress in the substrate 20 that would exceed a safe level, e.g., 10% to 15%, of the flexural strength of the substrate 20 (flexural strength of the substrate 20 being its strength in bending, that is, its resistance to fracture).

In an example of a preferred first embodiment, the length L of the arcuate surface 12 is 3.440 inches, the uniformly distributed load P is 92 pounds per linear inch, and the flexural stiffness constant C of the substrate is 0.043 inches squared per pound. The resulting value of $Y_{max}$ is 0.012 inches. This example embodiment would be appropriate for use with substrates with initial warpage that is less than 0.012 inches.

Because the heatsink 10 of the first embodiment is curved only along one axis, the first embodiment allows the heatsink 10 to be produced by the process of extrusion. Extrusion is a process where a metal, for example aluminum, is heated into a semisoft state, and then forced through the orifice of a die to produce a piece formed in the shape of the desired product. The piece is then allowed to cool, resuming a solid state. This process is preferable from a manufacturing standpoint, in that no complex machining is required to produce the heatsink 10. Current extrusion techniques have also become very accurate. The heatsink 10 of the preferred embodiment may thus be economically mass produced.

Now with reference to FIG. 4, a method of assembling the apparatus is described. First, the initial fabrication warpage of the substrate 20 is measured by placing a side of the substrate 20 (for example, side 24), against a first flat surface, and the opposite side of the substrate 20 (for example, side 22), against a second flat surface parallel to the first flat surface. The warpage of the substrate 20, defined herein as deviation from flat, is equal to the distance between the first flat surface, and the second parallel flat surface, minus the thickness of the substrate. If the warpage of the substrate 20 is not less than the $Y_{max}$ of the curve defining the arcuate surface 12 of the heatsink 10, the substrate 20 is discarded. If the warpage of the substrate 20 is less than the $Y_{max}$ of the curve defining the arcuate surface 12 of the substrate 10, the substrate 20 is mated with the heatsink 10. Through this process of substrate screening, only substrates whose warpage can be substantially corrected through mating with the heatsink 10 are used.

Then, the notched retainer strips 30 are placed adjacent to the heatsink 10 with the substrate 20 between the notched portion of the notched retainer strips 30 and the heatsink 10. The holes 31 in the retainer strips 30 are aligned with the threaded screw holes 16 in heatsink 10. The screws 32 are then passed through the holes 31 in the retainer strips 30 and rotated into the threaded screw holes 16 in the heatsink 10. As the screws 32 are rotated, the retainer strips 30 press the substrate 20 into conformance with the arcuate surface 12 of heatsink 10 resulting in the substrate 20 being flexed and the bottom surface 24 of the substrate 20 gaining intimate continuous thermal contact with the arcuate surface 12 of the heatsink 10. The screws 32 are tightened sufficiently to hold the substrate 20 in place securely between the notched retainer strips 30 and the heatsink 10. The screws 32 are not tightened so much that substrate 20 is crushed, or so much that the thermal expansion differences between the heatsink 10 and the substrate 20 cannot be compensated for through some lateral shifting of the two parts. Failure of any of the electronic devices 40 may require that the substrate 20 be separated from the heatsink 10 for repair. This can be accomplished simply by removing the screws 32. Reassembly can be accomplished through the above described assembly process.

Figure 5:
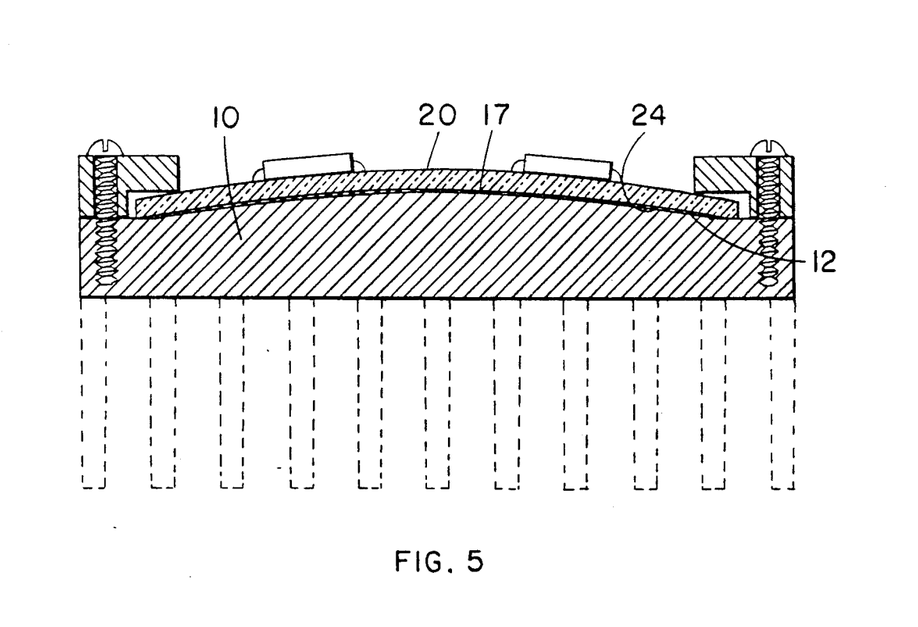
FIG. 5 is a cross section view of the apparatus of FIG. 1 along line 1—1 as assembled.

FIG. 5 is a side cross section view following mating of the substrate 20 to the heatsink 10. The substrate 20 has been flexed over and attached to the heatsink 10. The second surface 24 of the substrate 20 and the arcuate surface 12 of heatsink 10 have formed a thermally conductive interface with a minimum of air pockets. Because the air pockets have been minimized, this interface may be sufficiently thermally conductive for many applications, without the use of thermal grease or adhesive.

Microscopic surface irregularities in the finishes of the second side 24 of the substrate 20 and the arcuate surface 12 of the heatsink 10 may cause microscopic air pockets between the two surfaces. The optional thermally conductive agent 17 between second surface 24 of the substrate 20 and the arcuate surface 12 of the heatsink 10, will eliminate these. This will result in even greater thermal conductivity at this interface.

Figure 6:
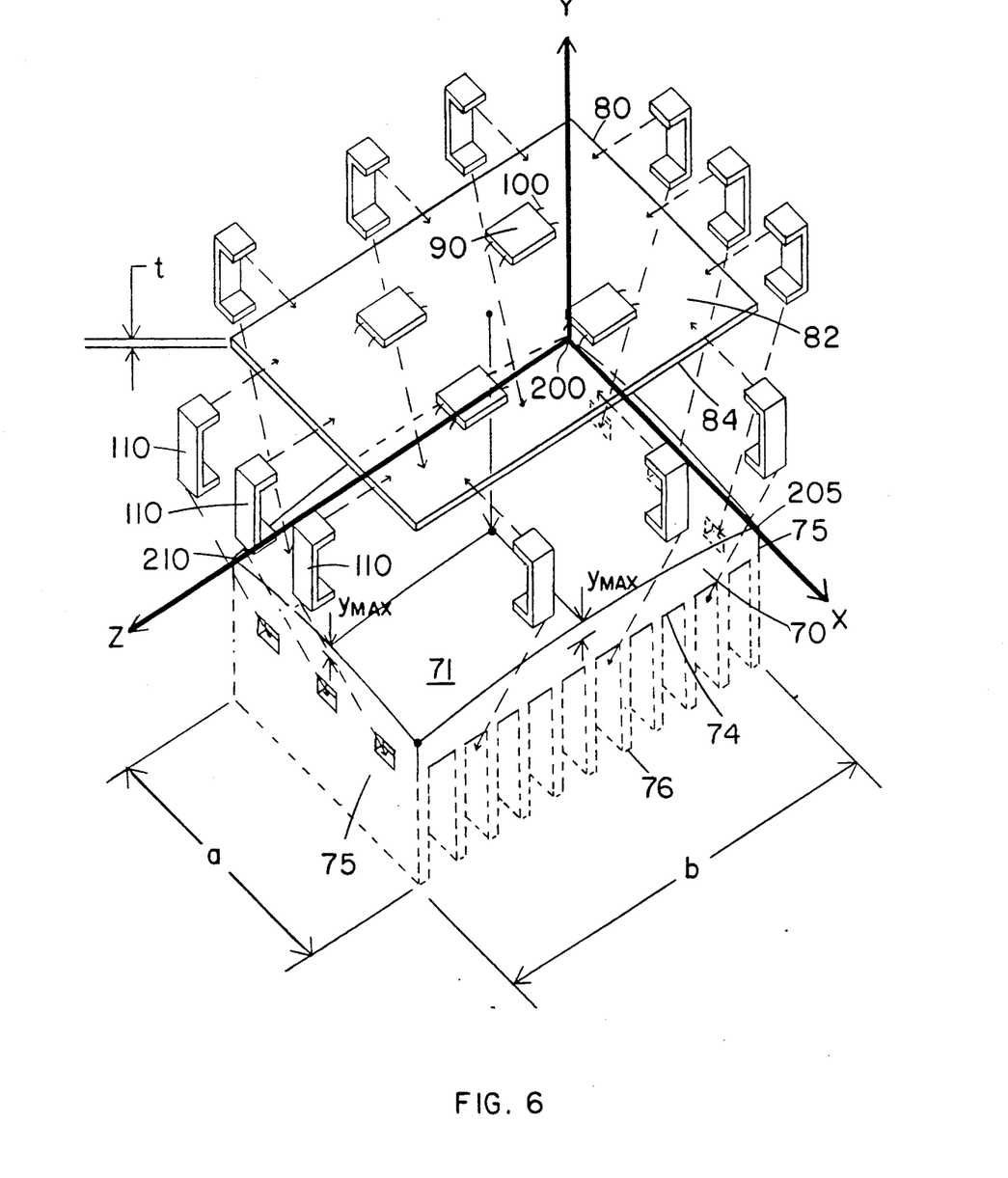
FIG. 6 is an isometric view of a second embodiment of a cooling apparatus, prior to assembly.

FIG. 6 shows a second embodiment of the invention, prior to assembly. A heatsink 70 includes an arcuate surface 71 that is arcuate in two dimensions, a surface 74 opposite the arcuate surface 71, and two side surfaces 75. The arcuate surface 71 has corners 200, 205, and 210. The length 'b' of the heatsink 70 is the distance between point 200 and point 210. The width 'a' of the heatsink 70 is the distance between point 200 and point 205. The surface 74 may optionally have heat dissipating fins 76 (shown in phantom), or pins (not shown). When optional heat dissipating fins 76 are present, side surfaces 75 include clip holes 77. The arcuate surface 71 of the heatsink 70 is convexly arched both along the length 'b' of the heatsink 70, and also along the width 'a' of the heatsink 70. In this way the second embodiment of the invention shown in FIG. 6 differs from the first embodiment shown in FIG. 1, where the arcuate surface of the heatsink is only arched along the length of the heatsink. The maximum amount of arch in the arcuate surface 71 is shown as $Y_{max}$. An optional, very thin (e.g. 0.001 inch) layer of a thermally conductive agent 78, for example polyphenyl ether, is shown on the arcuate surface 71 of the heatsink 70.

Further shown in FIG. 6 is a rectangularly shaped substrate 80, made of a relatively thermally conductive material, by way of example aluminum oxide, with a first surface 82, and a second surface 84. The substrate 80 has a thickness 't', a width 'a' (same as width 'a' of the heatsink 70), and a length 'b' (same as length 'b' of the heatsink 70). A plurality of heat producing and temperature sensitive devices 90, with top surfaces 92, and bottom surfaces 94 are mounted on the substrate 80. The electrodes of the electronic devices 90 are attached to the circuit traces (not shown) on the first surface 82 of the substrate 80 by means of electrically conductive terminals 100. For purposes of example, attachment means in FIG. 4 consist of clips 110.

Now with respect to FIG. 6, an example of the second embodiment is described. FIG. 6 shows a three dimensional coordinate system with origin at point 200. The X axis extends along a line connecting point 200 and point 205, the Z axis extends along a line connecting point 200 and point 210, and the Y axis extends from point 200, perpendicular to both the X axis and the Z axis. The profile of the arcuate surface 71 of the heatsink 70 along its width 'a', is a convex curve defined by the equation for a beam under a uniformly distributed load. The following is the equation:

$$Y = P * C * (X/a - 2(X^3/a^3) + (X^4/a^4))$$

where:
P = a uniformly distributed load along the length L of the arcuate surface 71 of the heatsink 70;
C = the flexural stiffness constant of the substrate 80, calculated as previously described;
a = the width of the substrate 70 between points 200 and 205; and X and Y = coordinates with respect to the coordinate system with origin at point 200, with X axis extending along the line between point 200 and point 205, and Y axis perpendicular to the X axis.

The profile of the arcuate surface 71 of the heatsink 70 along its length 'b', is a convex curve defined by the equation for a beam under a uniformly distributed load. The following is the equation:

$$Y = P * C * (Z/b - 2(Z^3/b^3) + (Z^4/b^4))$$

where:
P = a uniformly distributed load along the length 'b' of the arcuate surface 71 of the heatsink 70;
C = the flexural stiffness constant of the substrate 80, calculated as previously described;
b = the length of the substrate 70 between points 200 and 205; and
Z and Y = coordinates with respect to a two dimensional Cartesian coordinate system with origin at point 200, with Z axis extending along the line between point 200 and point 210, and a Y axis perpendicular to the Z axis.

The $Y_{max}$ value for the profile of the arcuate surface 71 of the heatsink 70 along its length 'b', is equal to the $Y_{max}$ value for the profile of the heatsink 70 along its width 'a'. This is required so that the arcuate surface 71 in continuous. The $Y_{max}$ may be calculated by the below equation:

$$Y_{max} = (C_1 * P * a^4)/(E * t)$$

where
P = a uniformly distributed load along both the length 'b' and the width 'a' of the arcuate surface 71 of the heatsink 70;
a = the size of the smaller side of the heatsink 70;
t = the thickness of the substrate 80;
E = the Young's modulus of the material of the substrate 80; and
$C_1$ = a value from Table 1.

The value of $C_1$ is a deflection coefficient for a simply supported rectangle under a uniform load, and is determined from the ratio of width to length of the substrate 80, as shown in Table 1. The values for $C_1$ in Table 1 are equivalent to the values for $\phi_2$ given in "Steel Plate Engineering Data—Volume 2: Useful Information on the Design of Plate Structures", published by the Committee of Steel Plate Producers, American Iron and Steel Institute, 1000 16th Street, N.W., Washington, D.C. 20036, June 1985, at page 5 in Table 1B, under the title "Stress and Deflection Coefficients—Rectangle", all disclosures of which are herein incorporated by reference.

TABLE 1

| a/b | $C_1$ |
| --- | --- |
| 1.0 | 0.0443 |
| 1.25 | 0.0616 |
| 1.5 | 0.0770 |
| 1.6 | 0.0906 |
| 1.75 | 0.1017 |
| 2.0 | 0.1106 |
| 3.0 | 0.1136 |
| 4.0 | 0.1400 |
| 5.0 | 0.1416 |
| ∞ | 0.1422 |

Using this formula, a value for P is selected, such that the heatsink 70 has an arcuate surface 71 having a $Y_{max}$ greater than the typical initial warpage of the substrate 80.

Figure 7:
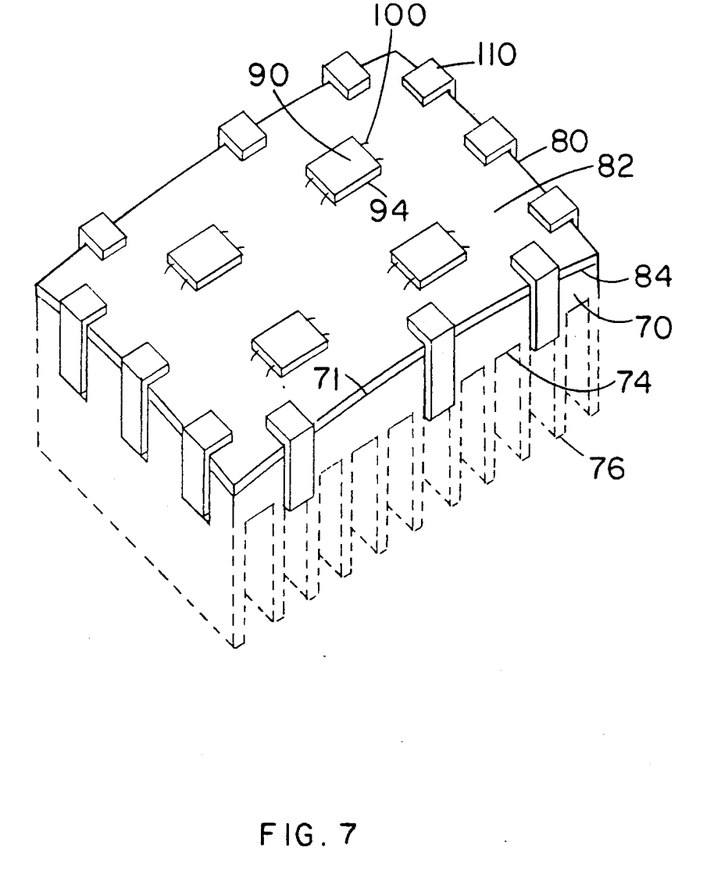
FIG. 7 is an isometric view of the apparatus of FIG. 6 as assembled.

FIG. 7 shows the elements of FIG. 6 following assembly. The substrate 80 is attached to the heatsink 70 for example by attachment means such as clips 110. The second surface 84 of the substrate 80 is in thermal contact with the arcuate surface 71 of the heatsink 70.

The operation of the elements in FIG. 7 is similar to that described for the elements shown in FIG. 1. During the operation of the electronic devices 90, heat is produced which must be removed to ensure proper operation and prevent destruction of the electronic devices 90. Heat is transferred from the bottom surfaces 94 of the devices 90 to the first surface 82 of the substrate 80, through the substrate 80, from the second surface 84 of the substrate 80, to the arcuate surface 71 of the heatsink 70, and through the heatsink 70 for dissipation by a coolant.

Figure 8:
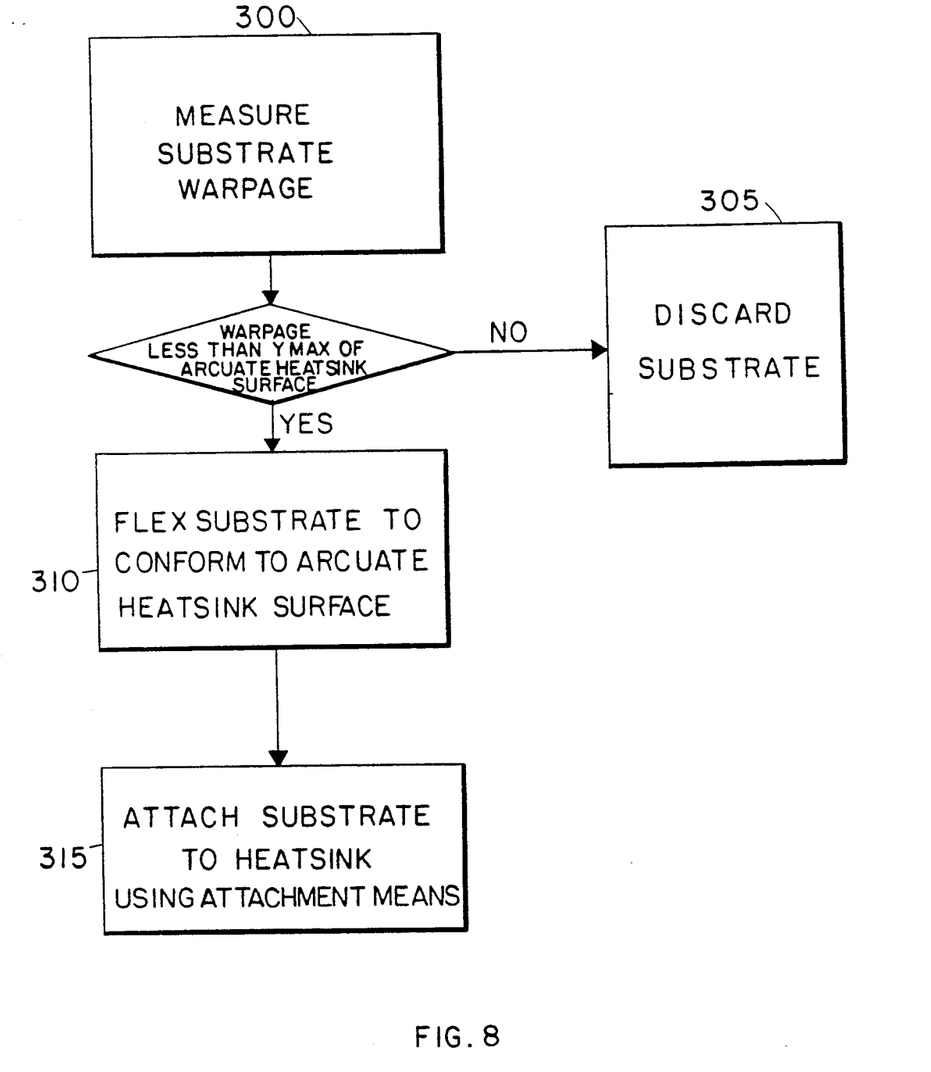
FIG. 8 is a flow diagram of a first method of producing a cooling apparatus.

FIG. 8 is a flow diagram of a first method of producing the cooling apparatus. First, in step 300, the warpage of the substrate is measured (see FIG. 2). If the warpage of the substrate is not less than the $Y_{max}$ of the arcuate surface of the heatsink, the substrate is discarded, in step 305. If the warpage of the substrate is less than the $Y_{max}$ of the arcuate surface of the heatsink, the substrate is flexed to conform to the arcuate surface of the heatsink in step 310. Attachment means are then applied to hold the substrate in close thermal contact with the heatsink in step 315.

Figure 9:
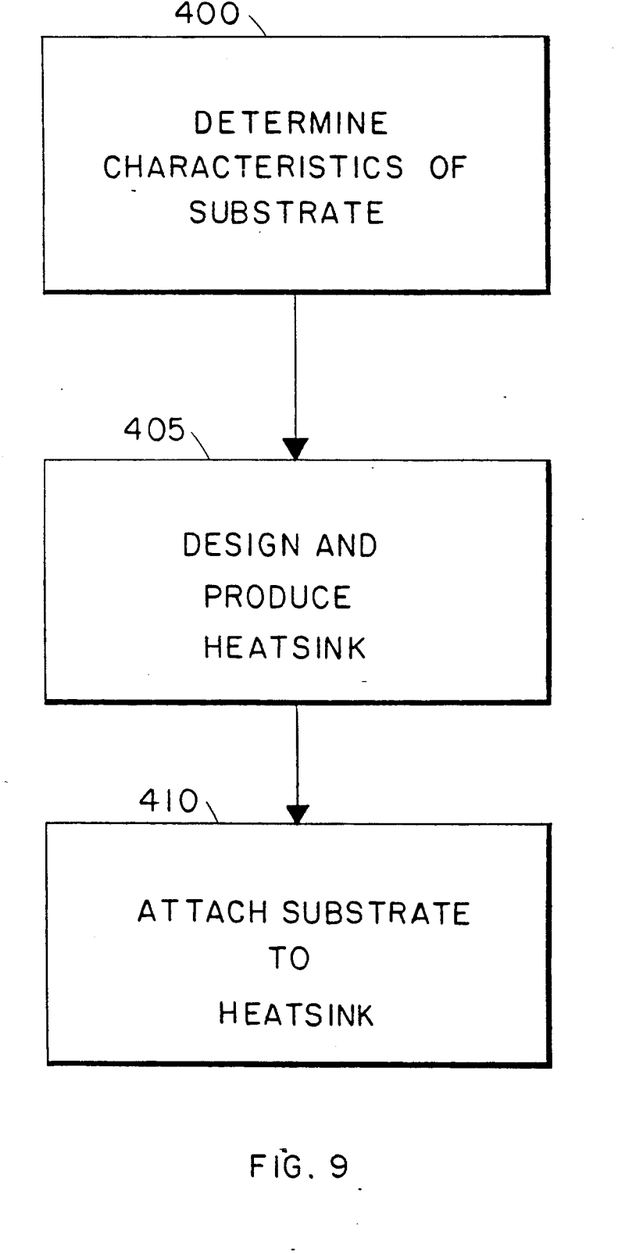
FIG. 9 is a flow diagram of a second method of producing a cooling apparatus.

FIG. 9 is a flow diagram of a second method of producing the cooling apparatus. First, in step 400, the relative characteristics of the substrate are determined. These characteristics include the length, flexural strength, and initial warpage of the substrate, as well as the Young's modulus of the substrate material.

Then in step 405, the characteristics of the substrate are used to design and produce a heatsink. The heatsink design includes a convex arcuate surface. The curve of the convex arcuate surface is defined by the below equation:

$$Y = P * C * (X/L - (2 * (X^3/L^3)) + X^4/L^4)$$

where:
P = a uniformly distributed load along the length L of the heatsink;
C = the flexural stiffness constant of the substrate;
L = the length along the arcuate surface of the heatsink; and
X and Y = coordinates with respect to a two-dimensional Cartesian coordinate system with origin on the arcuate surface of the heatsink.

Finally, in step 410, the substrate is flexed to conform to the arcuate surface of the heatsink, and attachment means are applied to hold the substrate in close thermal contact with the heatsink.

Although the above description has proceeded with reference to an apparatus for cooling electrical components mounted on a ceramic substrate, it is to be understood that the apparatus as is disclosed herein may be adapted to a wide variety of cooling systems where there is a need to provide a thermally conductive, detachable, and mechanically stress free interface between the heat producing devices and the heatsink. Therefore, the invention is not necessarily limited to the particular embodiment shown herein. It is to be understood that various other adaptations and modifications may be made within the spirit and scope of the invention.

What is claimed is:

1. A cooling apparatus for a heat generating device comprising:
    a substrate, on which is mounted said heat generating device;
    a heatsink including a convex arcuate surface, said arcuate surface curved along a single axis, the profile of said convex arcuate surface defined by the following equation:

$$Y = P * C * (X/L - (2 * (X^3/L^3)) + X^4/L^4)$$

where:
P = a uniformly distributed load along the length L of said convex arcuate surface of said heatsink;
C = the flexural stiffness constant of said substrate;
L = the length of said convex arcuate surface of said heatsink;
X and Y = coordinates defining the curve with respect to a two-dimensional Cartesian coordinate system having an origin on said convex arcuate surface; and
means for maintaining said substrate in close contact with said arcuate surface of said heatsink.

2. The cooling apparatus according to claim 1 wherein the value for said uniformly distributed load (P) is selected such that the maximum Y value is:
    equal to or greater than an initial warpage of said substrate; and
    limited such that the flexure in said substrate following attachment to said heatsink does not introduce stress in said substrate that exceeds a small percentage of the flexural strength of said substrate.

3. The cooling apparatus according to claim 1 wherein said heatsink comprises a thermally conductive material.

4. The cooling apparatus according to claim 3 wherein said thermally conductive material is aluminum.

5. The cooling apparatus according to claim 1 further comprising a thermally conductive agent between said substrate and said heatsink.

6. The cooling apparatus according to claim 5 wherein said thermally conductive agent is polyphenyl ether.

7. The cooling apparatus according to claim 1 wherein said heatsink further comprises heat dissipating fins or pins.

8. The cooling apparatus according to claim 1 wherein said substrate is rectangular.

9. The cooling apparatus according to claim 8 wherein said means for maintaining comprises notched retainer strips and screws.

10. The cooling apparatus according to claim 1 wherein said substrate comprises a thermally conductive dielectric material.

11. The cooling apparatus according to claim 10 wherein said thermally conductive dielectric material is aluminum oxide.

12. A cooling apparatus for a heat generating device comprising:
    a substrate, on which is mounted said heat generating device;
    a heatsink including a convex arcuate surface, said convex arcuate surface being curved along a width of said heatsink and along a length of said heatsink, the profile of said convex arcuate surface along said width of said heatsink is defined by the following equation:

$$Y = P * C * (X/a - (2 * (X^3/a^3)) + X^4/a^4)$$

where:
P = a uniformly distributed load along said width of said convex arcuate surface of said heatsink;
C = the flexural stiffness constant of said substrate.
a = the width of said convex arcuate surface of said heatsink;
X and Y = coordinates defining the curve with respect to a three-dimensional Cartesian coordinate system having an origin on said convex arcuate surface, with an X axis extending along said width of said heatsink, and a Y axis perpendicular to said X axis; and
means for maintaining said substrate in close contact with said arcuate surface of said heatsink.

13. The cooling apparatus of claim 12, wherein the profile of said convex arcuate surface along said length of said heatsink is defined by the following equation:

$$Y = P * C * (Z/b - (2 * (Z^3/b^3)) + Z^4/b^4)$$

where:
P = a uniformly distributed load along said length of said convex arcuate surface of said heatsink;
C = the flexural stiffness constant of said substrate.
b = the length of said convex arcuate surface of said heatsink;
Z and Y = coordinates defining the curve with respect to a three-dimensional Cartesian coordinate system having an origin on said convex arcuate surface, with a Z axis extending along said length of said heatsink and said Y axis perpendicular to said Z axis.

14. The cooling apparatus according to claim 13 wherein the value for said uniformly distributed load (P) is selected such that the maximum Y value is:
equal to or greater than an initial warpage of said substrate; and
limited such that the flexure in said substrate following attachment to said heatsink does not introduce stress in said substrate that exceeds a small percentage of the flexural strength of said substrate.

15. The cooling apparatus according to claim 14 wherein said small percentage of the flexural strength of said substrate is less than 15%.

16. The cooling apparatus according to claim 15 wherein said heatsink comprises a thermally conductive material.

17. The cooling apparatus according to claim 16 wherein said thermally conductive material is aluminum.

18. The cooling apparatus according to claim 17 wherein said heatsink further comprises heat dissipating fins or pins.

19. A method of producing a cooling apparatus for a heat generating device mounted on a substrate, comprising the steps of:
measuring the initial warpage of said substrate;
if the initial warpage of said substrate is not less than a predetermined value, discarding said substrate;
if the initial warpage of said substrate is less than said predetermined value, flexing said substrate over a convex arcuate surface of a heatsink and attaching said substrate to said heatsink using an attachment means such that said substrate and said heatsink are in close thermal contact.

20. The method as defined in claim 19, wherein said convex arcuate surface of said heatsink is curved along a single axis, and wherein the profile of said convex arcuate surface is defined by the following equation:

$$Y = P * C * (X/L - (2 * (X^3/L^3)) + X^4/L^4)$$

where:
P = a uniformly distributed load along the length L of said convex arcuate surface of said heatsink;
C = the flexural stiffness constant of said substrate;
Y = the length of said convex arcuate surface of said heatsink; and
X and Y = coordinates defining the curve with respect to a two-dimensional Cartesian coordinate system having an origin on said convex arcuate surface. ,;

21. The method as defined in claim 19, wherein said convex arcuate attachment surface of said heatsink is curved along a width of said heatsink and along a length of said heatsink, wherein the profile of said convex arcuate surface along said width of said heatsink is defined by the following equation:

$$Y = P * C * (X/a - (2 * (X^3/a^3)) + X^4/a^4)$$

where:
P = a uniformly distributed load along said width of said convex arcuate surface of said heatsink;
C = the flexural stiffness constant of said substrate.
a = the width of said convex arcuate surface of said heatsink;
X and Y = coordinates defining the curve with respect to a three-dimensional Cartesian coordinate system having an origin on said convex arcuate surface, with an X axis extending along said width of said heatsink, and a Y axis perpendicular to said X axis, and wherein the profile of said convex arcuate surface along said length of said heatsink is defined by the following equation:

$$Y = P * C * (Z/b - (2 * (Z^3/b^3)) + Z^4/b^4)$$

where:
P = a uniformly distributed load along said length of said convex arcuate surface of said heatsink;
C = the flexural stiffness constant of said substrate.
b = the length of said convex arcuate surface of said heatsink;
Z and Y = coordinates defining the curve with respect to a three-dimensional Cartesian coordinate system having an origin on said convex arcuate surface, with a Z axis extending along said length of said heatsink, and said Y axis perpendicular to said Z axis.

22. A method of producing a cooling apparatus for a heat generating device mounted on a substrate, comprising the steps of:
determining relevant characteristics of said substrate, said relevant characteristics of said substrate including the length of said substrate, the Young's modulus of the material of said substrate, the moment of inertia of said substrate, the initial warpage of said substrate, and the flexural strength of said substrate;

designing and producing a heatsink with a convex arcuate surface based on said characteristics of said substrate; and flexing said substrate over said convex arcuate surface of said heatsink and attaching said substrate to said heatsink using an attachment means such that said substrate and said heatsink are in close thermal contact.

23. The method as defined in claim 22, wherein said designing and producing said heatsink comprises calculating a curve that defines said convex arcuate surface of said heatsink by selecting a value for P in the equation:

$$Y = P * C * (X/L - (2 * (X^3/L^3)) + X^4/L^4)$$

where:

P = a uniformly distributed load along the length L of said convex arcuate surface of said heatsink;

C = the flexural stiffness constant of said substrate;

L = the length of said convex arcuate surface of said heatsink; and

X and Y = coordinates defining the curve with respect to a two-dimensional Cartesian coordinate system having an origin on said convex arcuate surface.

24. The method as defined in claim 23, wherein said value for P is selected such that the equation defining said convex arcuate surface of said heatsink has a maximum Y value that exceeds the initial warpage of said substrate, and wherein said value for P is selected such that the maximum Y value in said curve does not cause stress in said substrate following attachment to said heatsink exceeding 15% of the flexural strength of said substrate.

* * * * *